(12) United States Patent
Baglin et al.

(10) Patent No.: US 6,866,898 B2
(45) Date of Patent: Mar. 15, 2005

(54) METHOD AND APPARATUS FOR LINKING AND/OR PATTERNING SELF-ASSEMBLED OBJECTS

(75) Inventors: John E. E. Baglin, Morgan Hill, CA (US); Hendrik F. Hamann, Mohegan Lake, NY (US); Shouheng Sun, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 214 days.

(21) Appl. No.: 10/341,805

(22) Filed: Jan. 14, 2003

(65) Prior Publication Data

US 2003/0134053 A1 Jul. 17, 2003

Related U.S. Application Data

(62) Division of application No. 09/930,979, filed on Aug. 17, 2001, now Pat. No. 6,566,665.

(51) Int. Cl.[7] .............................................. B05D 3/06
(52) U.S. Cl. ...................... 427/496; 427/502; 427/130; 427/132; 427/190; 427/191; 427/197
(58) Field of Search ........................... 427/96, 282, 496, 427/502, 504, 130–132, 190–192

(56) References Cited

U.S. PATENT DOCUMENTS

| | | | | |
|---|---|---|---|---|
| 4,400,408 | A | * | 8/1983 | Asano et al. |
| 4,802,951 | A | | 2/1989 | Clark et al. |
| 5,077,085 | A | | 12/1991 | Schnur et al. |
| 5,820,945 | A | * | 10/1998 | Wei et al. |
| 6,162,532 | A | | 12/2000 | Black et al. |
| 6,254,662 | B1 | | 7/2001 | Murray et al. |
| 6,348,295 | B1 | * | 2/2002 | Griffith et al. |
| 6,355,926 | B1 | * | 3/2002 | Hubble, III et al. |
| 2002/0084429 | A1 | | 7/2002 | Craighead et al. |

OTHER PUBLICATIONS

Chou, Stephen Y., "Patterned Magnetic Nanostructures and Quantized Magnetic Disks", Proceedings of the IEEE, vol. 85, No. 4, Apr. 1997, pp. 652–671.
Baselt, David R., et al., "A High–Sensitivity Mircomachined Biosensor", Proceedings of the IEEE, vol. 85, No. 4, Apr. 1997, pp. 672–680.
Eppler, Aaron S., et al., "Thermal and Chemical Stability and Adhesion Strength of Pt Nanoparticle Arrays Supported on Silica Studied by Transmission Electron Microscopy and Atomic Force Microscopy", J. Phys. Chem. B 2000, 104, 7286–7292.
Sun, Shouheng, et al., "Monodisperse FePt Nanoparticles and Ferromagnetic FePt Nanocrystal Supperlattices", Science, vol. 287, Mar. 17, 2000, pp. 1989–1992.
Yu, A., et al., "Lorentz Transmission Electron Microscopy of Focused Ion Beam Patterned Magnetic Antidot Arrays", Applied Physics Letters, vol. 77, No. 19, Nov. 6, 2000, pp. 3063–3065.
New, R.M.H., et al., "Physical and Magnetic Properties of Submicron Lithographically Patterned Magnetic Islands", J. Vac. Sci. Technol. B 13(3), May/Jun 1995, pp. 1089–1094.

* cited by examiner

Primary Examiner—Fred J. Parker
(74) Attorney, Agent, or Firm—McGinn & Gibb, PLLC; Wan Yee Cheung, Esq.

(57) ABSTRACT

A method and related apparatus to link and/or pattern self-assembled first objects to a second object. Each of the first object (e.g., a nanoparticle) can be embedded in a mobile binder (i.e., a stabilizer). The invention applies energy to the first object and stabilizer, links this first object to the second object, and provides a controlled linkage of the first object with respect to the second object. Applying this procedure to many such objects results in a larger a real arrangement of these linked objects. An appropriate solvent may be used to remove non-linked objects, yielding a patterned array. Thermal annealing can be applied to control the physical and chemical properties of the array.

14 Claims, 7 Drawing Sheets

METHOD AND APPARATUS FOR LINKING AND/OR PATTERNING SELF-ASSEMBLED OBJECTS

CROSS-REFERENCE TO RELATED APPLICATIONS

This application is a division of U.S. application Ser. No. 09/930,979 filed Aug. 17, 2001 now U.S. Pat. No. 6,566,665.

FIELD OF THE INVENTION

The present invention generally relates to a method and an apparatus for controlled linking/patterning of self-assembled, preferably nano-sized objects, and more particularly to ultra-high density data storage.

DESCRIPTION OF THE RELATED ART

This invention can be applied to various technologies, which realization relies on a method and an apparatus for controlled linking/patterning of self-assembled objects. As a particular example, patterning self-assembled magnetic objects into object-containing dot arrays with precise control of dot size and inter-dot spacing has technologically great potential in future ultrahigh density magnetic data storage. Specifically, ultrahigh density magnetic storage requires continued down scaling of each individual storage bit. In the past, this growth of storage densities has been accomplished simply by scaling down the grain size in the magnetic media, while maintaining the numbers of grains constant within one bit cell due to signal to noise requirements in the magnetic readout (transition noise). However, this scaling approach will come to an end in the near future, because with decreasing grain size the thermal energy can reverse more easily the magnetization direction (superparamagnetism), which eventually will result in the loss of the stored information. As one approach to circumvent the superparamagnetic limit and to increase further storage densities, patterned magnetic media has been proposed. More specifically, patterned media is a solution to the signal to noise constraints by creating a "dot" array of magnetic entities, where each dot contains one or more magnetic grains or objects. Previous efforts in fabricating such dot arrays relied on complicated and expensive lithographic processes, including e-beam lithography [R. M. H. New, R. F. W. Pease, R. L. White, J. Vac. Sci. Technol. B, 13, 1089 (1995); C. Haginoya, et al, J. App. Phys., 85, 8327 (1999); A. Y. Toporov, R. M. Langford, A. K. Petford-Long, App. Phys. Lett., 77, 3063 (2000)], Ion beam lithography [T. Devolder, et al, Appl. Phys. Lett., 74, 3383 (1999); W. M. Kaminsky, et al, Appl. Phys. Lett., 78, 1589 (2001)], optical lithography [M. Farhoud, et al, IEEE Trans. Magn., 34, 1087 (1998)] and nanoimprint lithography [S. Y. Chou, P. R. Krauss, P. J. Renstrom, Science, 272, 85 (1996); S. Y. Chou, P. R. Krauss, L. Kong, J. App. Phys., 79, 6101 (1996). A. Lebib, S. P. Li, M. Natali, Y. Chen, J. App. Phys., 89, 3892 (2001)]. Recently, direct patterning of passivated gold nanoclusters via e-beam has been proposed and demonstrated under high vacuum conditions [X. M. Lin, R. Parthasarathy, H. M. Jaeger, Appl. Phys. Lett., 78, 1915 (2001); T. R. Bedson, R. E. Palmer, T. E. Jenkins, D. J. Hayton, J. P. Wilcoxon, Appl. Phys. Lett., 78, 1921 (2001); T. R. Bedson, R. E. Palmer, J. P. Wilcoxon, Appl. Phys. Lett., 78, 2061 (2001)]. However, good control of nanoparticle-containing dots has not been reached. In contrast to these previous efforts, the present invention offers a very simple solution by providing a potentially inexpensive method and an apparatus capable of linking and/or patterning self-assembled (magnetic) objects. While this invention has been described mostly in terms of ultrahigh density data storage, the same methods/apparatus can be applied to other important applications, of which two examples are discussed more in detail below.

As a second example, this invention may relate to fabrication of highly sensitive sensors [D. R. Baselt, et al, Proceedings of the IEEE, 85, 672 (1997); Q. Sqalli, M. P. Brenal, P. Hoffmann, F. Marquis-Weible, Appl. Phys. Lett. 76, 2134 (2000)]. Novel sensors, especially for near-field sensing, rely on a technique that can generate nanostructures preferably at the end of a sharp probe such as an atomic force microscope (U.S. Pat. No. 5,237,859) or a scanning tunneling microscope (U.S. Pat. No. 4,343,993) probe. More specifically, the present invention may allow to link a small magnetic nanoparticle (e.g. radius<10 nm) to the end of a, preferably heated, AFM/STM-probe, which results in high sensitivity for magnetic force sensing at high spatial resolution. Further, the present invention may be suitable to arrange a small highly polarizable nanoparticle at the end of a sharp probe (e.g., silicon probe or carbon nanotube), which can act as a small antenna greatly enhancing near-field optical sensing capabilities.

As a third example, this invention may relate to the preparation of efficient catalysts [A. S. Eppler et al., J. Phys. Chem. B, 104, 7286 (2000)]. Catalytic reactions generally require high pressure and high temperature conditions. However, current catalysts of small sized particles tend to aggregate under such conditions, resulting in the loss of their catalytic properties. This invention discloses a method and an apparatus, which avoids the aggregation of these particles, especially since the distance between the particles/islands of particles can be easily tuned.

The present invention builds upon the notion of self-assembly. Self-assembly is a low-cost and alternative (e.g., non-lithographic) way to organize objects, preferably nanoparticles, whereby these objects are used as functional building blocks for device fabrication, see U.S. Pat. No. 6,162,532, and U.S. patent application Ser. No. 09/359,638, now allowed, both of which introduce the self-assembly of magnetic nanoparticles into magnetic nanoparticle superlattices, and are hereby incorporated by reference; and an article by S. Sun, C. B. Murray, D. Weller, L. Folks, and A. Moser, Science 287, 1989 (2000). The self-organization is influenced by the nature of the interactions exhibited among the stabilized particles. Generally, it relies on weaker and less directional interactions, such as van der Waals interactions, to organize the particles, and as a result, the assembly is not robust in its initial form. Thermal annealing has been applied to induce the transformation of organic stabilizers around each particle to polymer or inorganic matrix that can efficiently increase the robustness of the assemblies [S. Sun, C. B. Murray, D. Weller, L. Folks, A. Moser, Science, 287, 1989 (2000)].

SUMMARY OF THE INVENTION

With the invention, by applying an energy source locally to a specific area, the assembly in that area is hardened and can also adhere to the substrate well. The unirradiated self-organized nanoparticles, connected by weak interactions, can be easily washed away with a solvent as described in detail below, whereby self-assembled nanoparticle dot patterns are formed. With the invention, the height/thickness of the dots can be tuned all the way down to 2 nm via the self-assembly deposition technique, and the diameter (or lateral dimension) of the dots can be tuned down to less than 10 nm depending on the energy source used. Thermal annealing may be applied to the patterned dots to control their physical properties as well. The reported procedure does not need prior substrate modification, as in common lithographic processes, and allows for patterning on any size and shaped substrates. In summary, this invention offers a low cost solution to patterned media by providing controlled assemblies of dot arrays over larger areas, and allowing for patterning with high lateral resolution.

The present invention describes a method and an apparatus for linking and/or patterning self-assembled first object (s) (e.g., nanoparticles), to which stabilizers are attached, to (a) second object(s) (e.g., surface) by applying energy to the first object(s). The energy, which is directed, preferably locally, to the object(s) may activate a chemical reaction among the stabilizers, and cross-links the objects. As a result, the first object(s) is (are) linked to the second object. In addition, the energy may be used to alter chemical or physical properties of the particles. For example, heating of FePt nanoparticles may be utilized for linking as well as changing the phase thereby turning the particles from paramagnetic to ferromagnetic. Repeating this procedure allows the invention to arrange (and alter) objects over larger areas. In some situations, it may be desirable to remove the remaining (non-linked) objects by applying an appropriate solvent to the remaining (non-irradiated) objects. Thermal annealing may be used to control physical and chemical properties of the patterned object(s).

Accordingly, in a first aspect of the present invention, disclosed is an apparatus/assembly suitable for linking and/ or patterning self-assembled object(s), preferably nanoparticles, preferably on a local scale, the apparatus comprising: self-assembled first object(s), preferably (a) nanoparticle(s); stabilizer(s) attached to the first object(s); second object(s) to which the first object(s) is linked; an energy source, which directs energy to the object(s) and/or stabilizer(s); and a controller/control mechanism for coordinating a mutual positioning of the directed energy and the object(s).

In a second aspect of the present invention, disclosed is a method suitable for linking self-assembled object(s), preferably nanoparticles, preferably on a local scale. The method comprises the following steps: providing an apparatus as described in the first aspect of the invention; self-assembling the first object(s); coordinating the mutual positioning of the incident energy and the object(s), generating and directing energy to the object(s) and/or stabilizer(s); and operating a controller so that linking is enabled by using an information signal for modulating the directed energy.

In a third aspect disclosed is a method suitable for patterning self-assembled object(s), preferably nanoparticles, preferably on a local scale. The method comprises all steps, which are described in the second aspect of this invention, as well as applying means, preferably a solvent, to remove nonlinked objects in order to generate a patterned structure, and thermal annealing.

BRIEF DESCRIPTION OF THE DRAWINGS

The foregoing and other objects, aspects and advantages will be better understood from the following detailed description of a preferred embodiment(s) of the invention with reference to the drawings, in which.

DETAILED DESCRIPTION OF PREFERRED EMBODIMENTS OF THE INVENTION

The present invention provides a method and an apparatus for linking and/or patterning self-assembled object(s). The method comprises materials that contain a first object with a stabilizer and a second object that can be linked to the first object. Energy is directed at the stabilizer to link the first and second objects. Finally, a solvent may be applied to the first and second objects to remove non-linked objects. As an example, the first object can comprise a FePt nanoparticle. Such a material is susceptible to linkage, and it displays potentially useful magnetic phase changes. When the energy is directed simultaneously at this nanoparticle and at the second object (another FePt nanoparticle or substrate) and at the stablizer that separates them, linkage of the objects is made. Applying this procedure to many such objects results in FePt nanoparticles being linked over a larger area.

Figure 1:
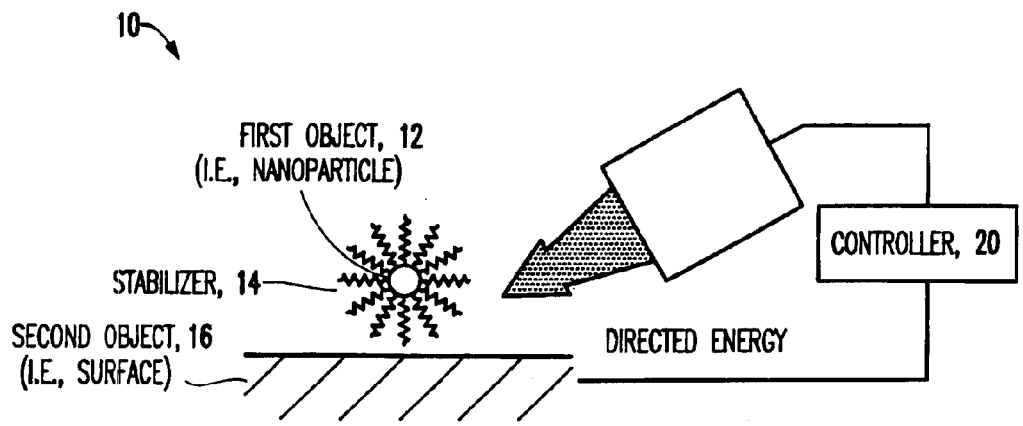
FIG. 1 shows a generalized scheme for an apparatus capable of linking and/or patterning self-assembled objects, wherein these first objects are surrounded by stabilizers.

FIG. 1 shows a generalized apparatus (10) in accordance with the invention. In particular, the apparatus comprises a nanoparticle as the first object (12) to which molecules are attached, referred to as stabilizers (14); a surface as the second object (16) to which the first object is linked; an energy source (18), which directs energy to the object(s) and/or stabilizer(s); and a controller/control mechanism (20) for coordinating mutual positioning of the directed energy in relation to these object(s) (with stabilizers), and for modulating the directed energy. Note that each of the first and second objects and the stabilizer can consist of one or more types of material with associated differing sizes and shapes.

Figure 2A:
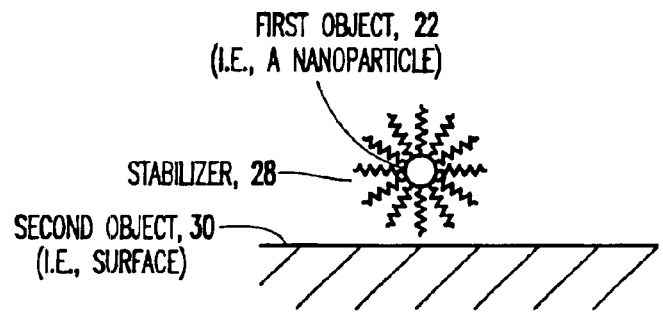
FIGS. 2A–2G show different examples for the first object (s) and the second object(s)
Figure 2B:
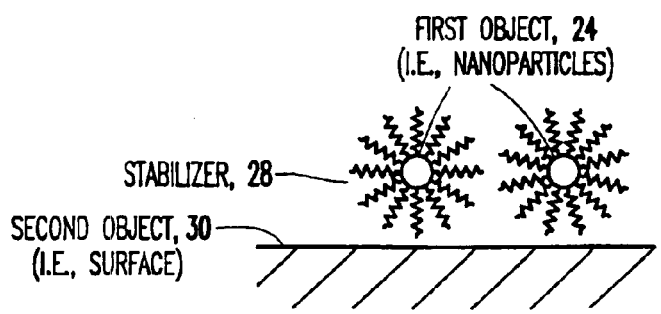
Figure 2C:
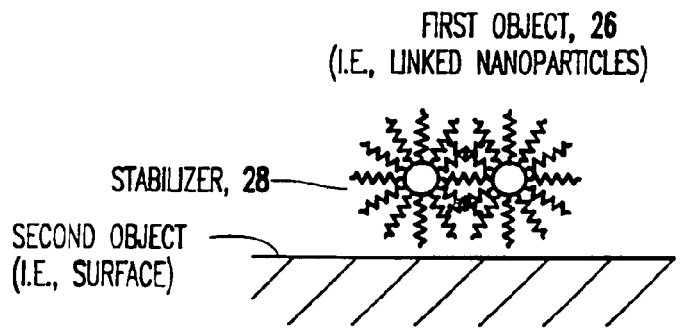

Illustrative examples for the first object(s) (12) are shown in FIGS. 2A–2G. The first object(s) can have various forms. These forms include a single nanoparticle (22) as shown in FIG. 2A, several nanoparticles (24) as shown in FIG. 2B, or an array of nanoparticles (26) as shown in FIG. 2C, which may be cross-connected. The dimensions of such illustrative nanoparticles can range in size between less than a nanometer and 1000 nm. The nanoparticles shown in FIGS. 2A–2G can have various shapes (e.g., spherical, ellipsoidal or cylindrical). These illustrative nanoparticles are made of various materials that include metals, such as Cu, Ag, Pd, Pt, Co, Fe, Ni, and their alloys, such as CoFe, NiFe, CoPd, FePd, CoPt, FePt, CoSm, metal oxides, such as $TiO_2$, $Fe_2O_3$, metal salts, such as CdSe, CdS, and inorganic/organic polymers, such as glasses, ceramics, in which CoPt and FePt are the most interesting materials for future ultrahigh density magnetic recording applications.

The stabilizer(s) (28) is attached to the first object(s) (22),(24), and (26) as shown in FIGS. 2A–2G. Ways of attaching the stabilizer(s) (28) to the first object(s) include chemical or physical bonds between the first object(s) and the stabilizer(s). Examples of materials of the stabilizer(s) include molecules with end functional groups consisting of —COO— (e.g. RCOOH), —CON— (e.g. RCONH$_2$), —CN (e.g. RCN), —NC (RNC), —S— (e.g. RSH), —O— (e.g. ROH), —N— (e.g. RNH$_2$), or —P— (e.g. R$_3$P) units, wherein R represents a hydrocarbon chain. In some circumstances, it may be advantageous to incorporate functional groups, such as a C—C double bond (e.g. R$_1$—CH=CH—R$_2$), C—C triple bond (e.g. R$_1$—CC—R$_2$), —COO— (e.g. R$_1$—COO—R$_2$), —CON— (e.g. R$_1$—CONH—R$_2$), —S— (e.g. R$_1$—S—R$_2$), —O— (e.g. R$_1$—O—R$_2$), —N— (e.g. R$_1$—NH—R$_2$), or —P— (e.g. R$_1$—PH—R$_2$) type unit(s), where R$_1$ represents the hydrocarbon chain while R$_2$ contains the end functional groups such as RCOOH, RCONH$_2$, RNH$_2$, RCN, RSH, ROH, into the stabilizer to enhance the linking process.

Figure 2D:
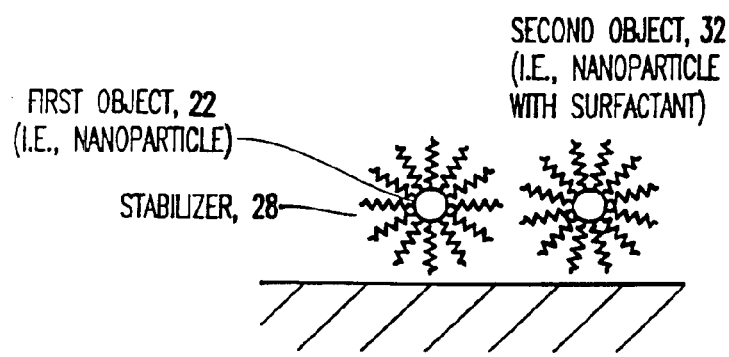
Figure 2E:
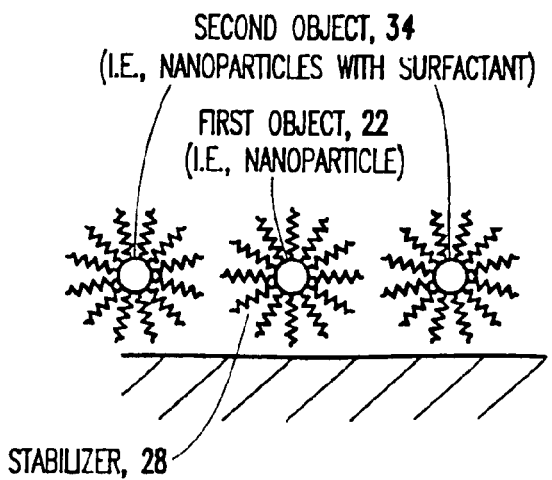
Figure 2F:
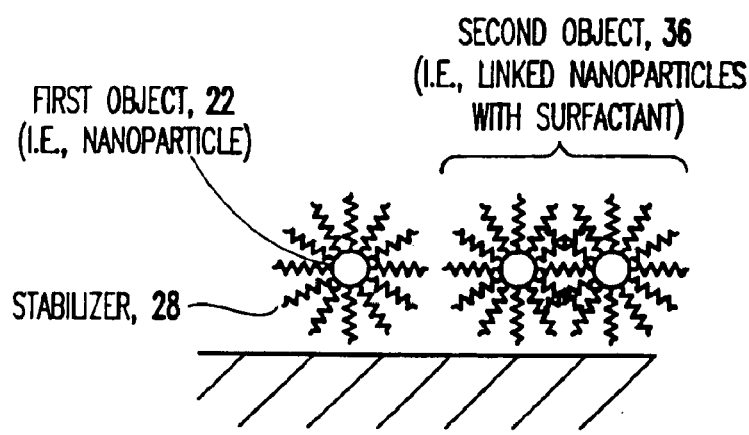
Figure 2G:
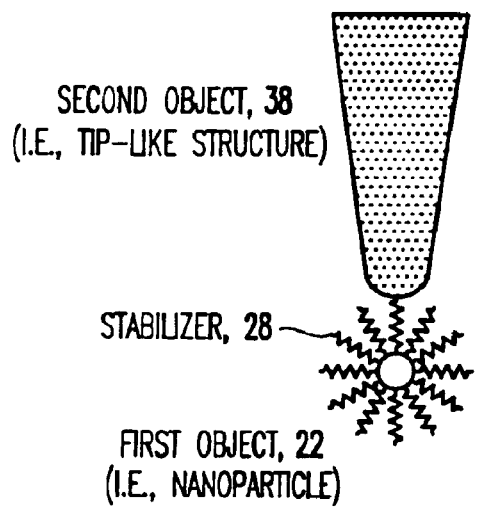

Illustrative second object(s) (16) are shown in FIGS. 2A—2G. Generally, the second object can be any type, comprising a flat surface (30), another nanoparticle (32) as shown in FIG. 2D, more than one nanoparticle with an optionally attached stabilizer(s) (34) as shown in FIG. 2E, other nanoparticles that are already linked (36) as shown in FIG. 2F, or a tip-like structure (38), as shown in FIG. 2G. The material of the second object(s) is preferably chosen to realize a reliable linkage to the first object(s). Each of the second objects has a shaped substrate that can be a flat, a curved, a spherical or a needle shape. As an example for ultrahigh density magnetic storage, the second object could be a glass disk as it is already used as a substrate in conventional magnetic storage media. Depending on the specific application, this disk may be treated (e.g., with a polymer) to enhance the linking process.

The energy source (18) can involve any kind electrons, ions, photons, phonons, plasmons, or excitons. As one example, the source is a laser, which has a beam that is focused with a lens on the stabilizer(s). An ion source (focused or patterned with a stencil mask or photoresist mask) is another example. Or a near-field optical source can also be positioned in close vicinity of the object(s).

The apparatus (10) includes a controller/control mechanism (20) for coordinating the mutual positioning of the directed energy at the objects and/or modulating the directed energy as shown in FIG. 1. As one illustrative example, the modulation can be enabled by supplying a current pulse from the controller to a laser diode (energy source), which beam heats the stabilizer for a short moment. Then, the first and second objects are moved by an actuator and another current pulse is applied to the laser diode. The controller/control mechanism comprises a piezo-electric, electro-static, electromagnetic, magnetic-strictive or a thermal-mechanical actuator. In other applications the controller may comprise an air-bearing surface adapted to fly over the surface as known from magnetic hard-drives in combination with a spindle and a motor. In other cases, the controller may comprise a stencil and/or photoresist mask.

Figure 3:
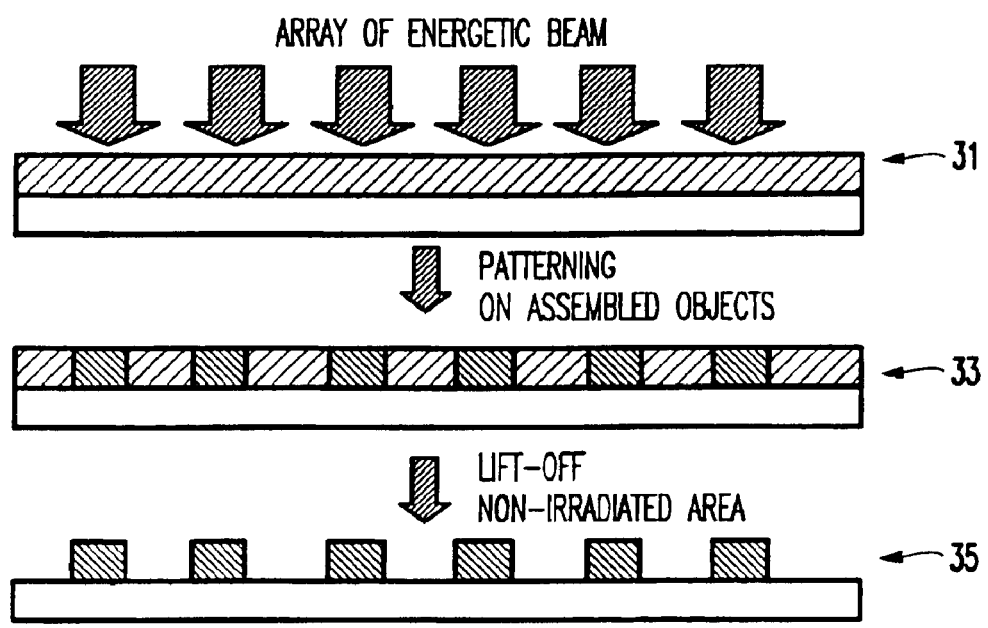
FIG. 3 shows an exemplary illustration of patterning of a continuous layer of self-assembled objects, using an array of energetic beams.

FIG. 3 shows an exemplary method of the invention as to how linking and/or patterning may occur using the self-assembled objects and using apparatus shown in FIG. 1. Initially, the method comprises self-assembly of the first object(s). Generally, the first object(s) (12) are synthesized with the stabilizer (14) surrounding the object(s) in an appropriate solvent as taught in U.S. Pat. No. 6,162,532, and U.S. patent application Ser. No. 09/359,638, now allowed, both of which are hereby incorporated by reference. The solvent then evaporates slowly at room temperature to form self-assembled object arrangements forming the first objects (12).

Next (31), an array of energetic beams of incident directed energy is aligned with respect to the self-assembled first objects (12). For example, a certain area of a sample, which consists of self-assembled nano-particles (i.e., first objects) on a substrate surface (i.e., second object) (16) that is moved into the focus of a laser beam (or an array of energetic beams).

Then, (33) the first object(s) (12) are patterned by being selectively exposed and linked via the stabilizer(s) to the second object(s). For example, modulating an information signal triggers a laser that is focused onto the first object(s) (12) and/or stabilizer(s) (14) and enables linking. Note that under certain circumstances, the exposure may also be used to control the physical and chemical properties of the object(s) and or stabilizer(s). Repeating these steps allows linking of the first object(s) (12) repeatedly at different locations to generate larger arrangements. For example, certain shapes (patterns) populated by nanoparticles may be generated.

Finally, non-linked objects may be removed by applying an appropriate solvent (35), which may yield arrays of islands containing little dots containing first object(s) (12). Generally, the solvent can be of any kind that can dissolve the first object(s) or their stabilizer, including solvents such as water, alcohol an alkane (pentane, hexane, heptane, octane, etc.), an arene (benzene, toluene, mesitylene, etc.), a chlorinated solvent (methylene chloride, chloroform, etc) and the type with unit of —COO— (e.g. CH$_3$COOC$_2$H$_5$), —CON— (e.g. CH$_3$CONHC$_2$H$_5$), —CN (e.g. CH$_3$CN), —NC (e.g. C$_3$H$_7$NC), —S— (e.g. C$_4$H$_9$SC$_4$H$_9$), —O— (e.g. C$_2$H$_5$OC$_2$H$_5$, —N— (e.g. C$_4$H$_9$NH$_2$), or —P— (e.g. (C$_4$H$_9$)$_3$P) type units.

Figure 4A:
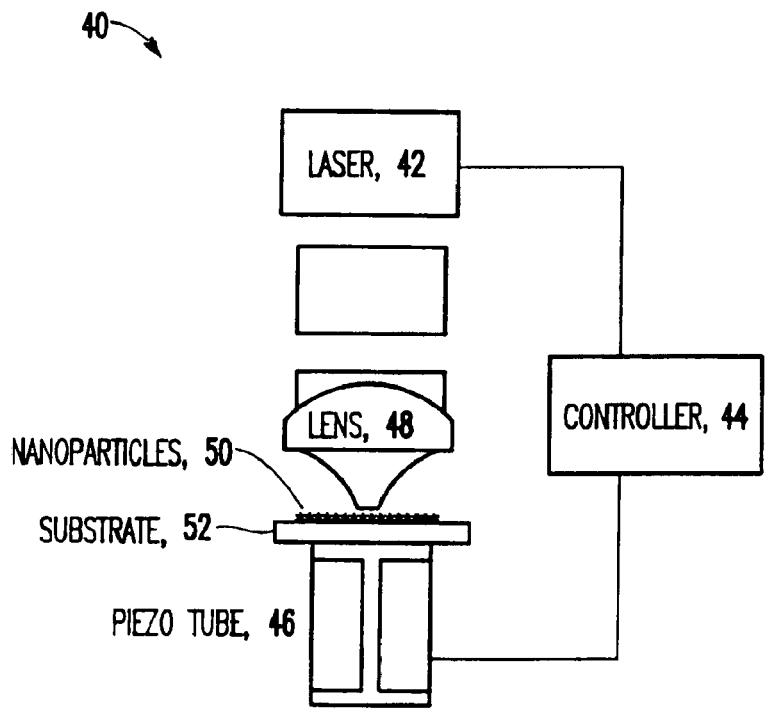
FIGS. 4A and 4B show two different forms of the apparatus that can be used to link and/or pattern self-assembled objects according to the invention.
Figure 4B:
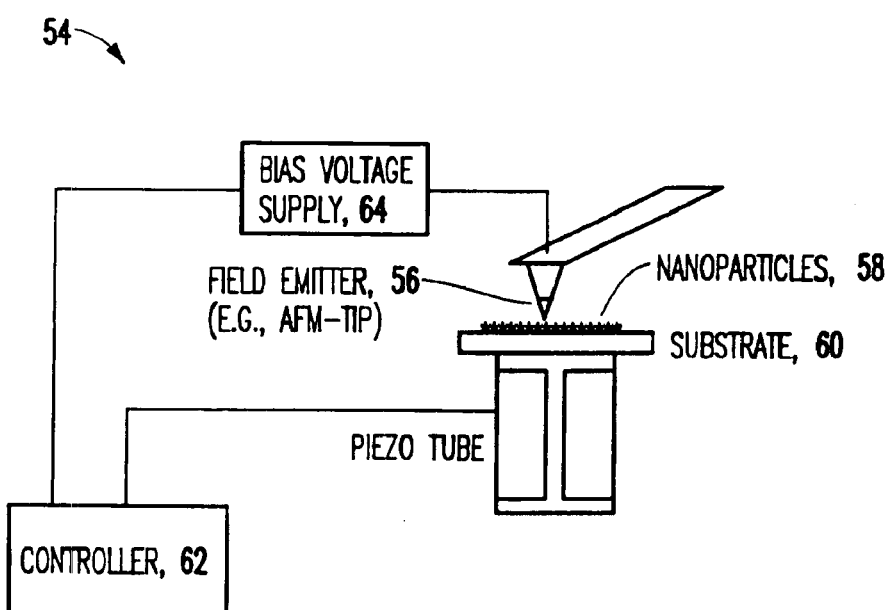

FIGS. 4A and 4B show two exemplary apparatus of the invention. In particular, FIG. 4A shows apparatus (40) with an energy source that is represented by a laser (42), wherein power can be modulated with an information signal supplied by a controller (44). This controller (44) also coordinates the mutual positioning of the objects with respect to the laser beam by supplying a high voltage to the piezo-tube (46). The laser is directed to different locations of the pattern being generated by a lens (48) towards the nanoparticles (50) (first objects), which are thereby arranged via self-assembly on a substrate (52) that is the second object. The resolution of the pattern in FIG. 4A is limited by the diffraction of the laser beam. However, other energy sources may improve the resolution significantly so that even single nanoparticles can be processed.

Referring now to FIG. 4B, apparatus (54) includes a field emitting tip (56) that directs electrons towards the nanoparticles (first objects) (58), whereby linkage occurs with the second object that is a surface (60). This tip can be part of an atomic force microscope (AFM) probe, or part of the recording device embedded in a current recording head. The controller (62) coordinates the mutual positioning between tip and first objects/stabilizers and controls the bias voltage (64), thereby enabling the patterned linkage process. In this example, the nanoparticles may have a conducting overcoat or the substrate can be electrically conductive, in order to have a counter electrode with respect to the field emitting tip.

Figure 5:
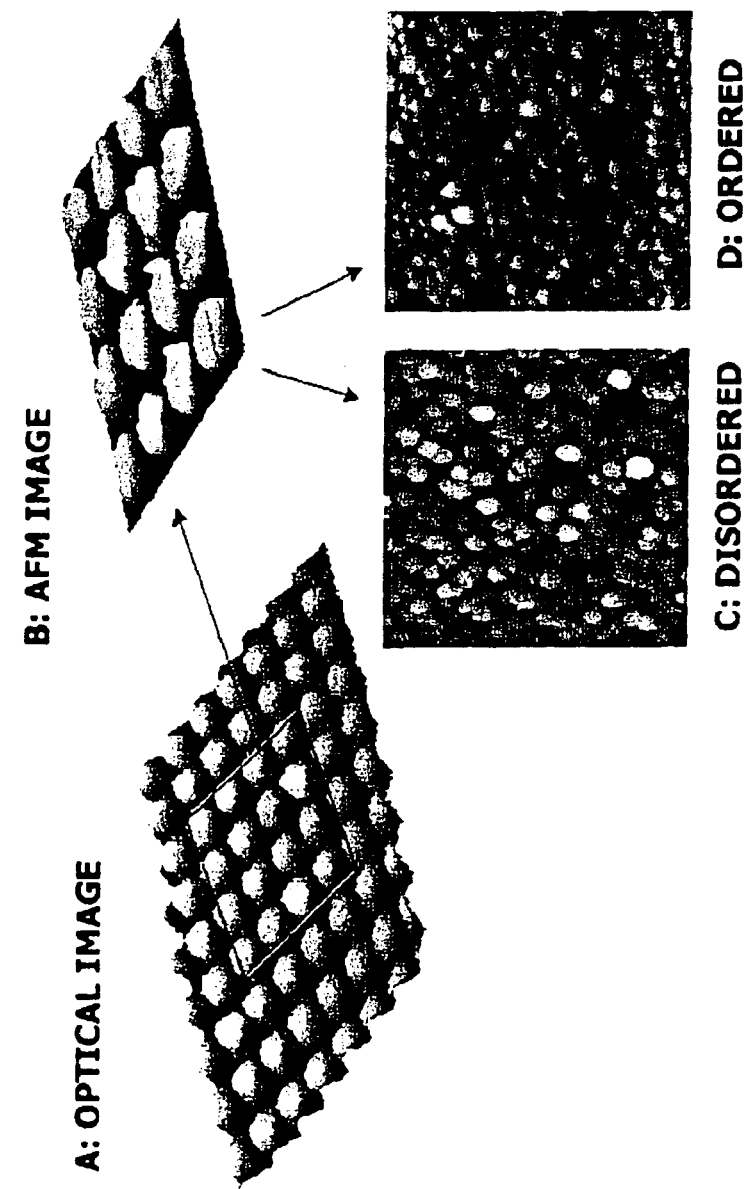
FIG. 5 shows an array of islands, each containing 6 nm FePt nanoparticles, as generated by a focused laser beam via FIG. 4A apparatus, wherein are displayed: an optical image of the patterned islands in section A; an AFM image of patterned islands in section B; and high resolution AFM images of self-assembled nanoparticles within an island with ordered (section C), and disordered (section D) structures that can be tuned by a self-assembly technique.

FIG. 5 shows experimental results obtained by using the invention. Specifically, patterned islands of self-assembled 6-nanometer FePt nanoparticles coated with oleic acid/oleyl amine as stabilizers were created via focused laser beam treatment and solvent wash. A focused laser beam (beam waist 0.8 micrometers) heats the nanoparticles (first object)

to 800 degrees centigrade for less than one second. The exposure cross-connects the first object nanoparticles and links them to the second object which is a flat glass substrate, while non-exposed nanoparticles are rinsed away from the surface with a solvent (e.g., hexane). Section A of FIG. 5 shows an optical image of a regular pattern of FePt nanoparticle islands. Section B of FIG. 5 shows an AFM-image of these islands, which are separated by 1 micrometer. Controlled self-assembly can yield different kinds of islands of nanoparticles with disordered (Section C of FIG. 5), and ordered (Section D of FIG. 5) nanoparticle arrays within each island.

Figure 6:
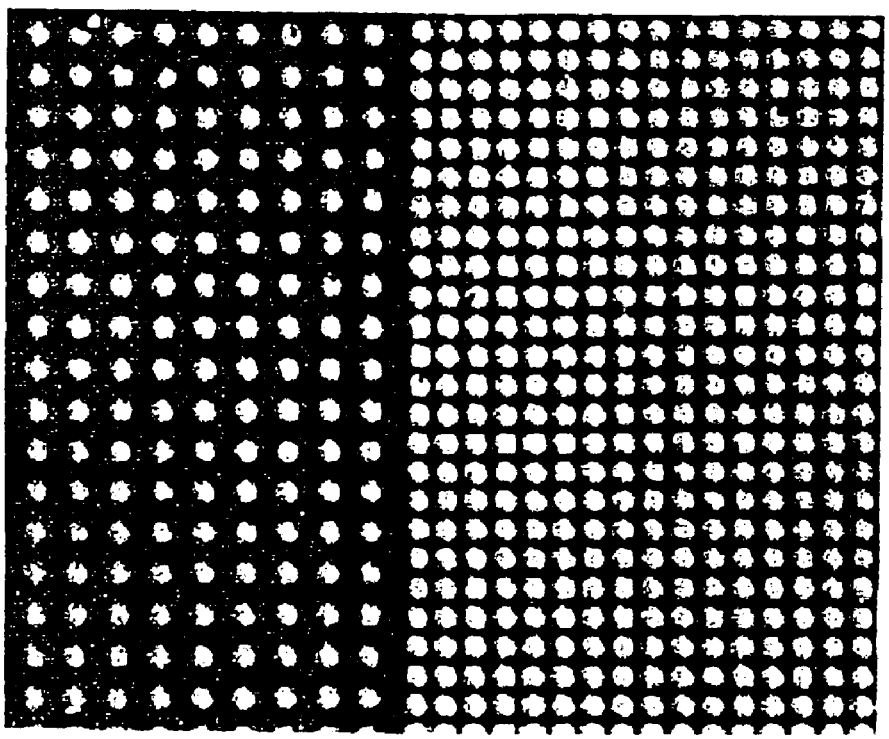
FIG. 6 shows an optical image of self-assembled 4 nm FePt nanoparticle containing islands that were generated by ion-beam exposure via a stencil mask.

FIG. 6 shows a result of ion beam patterned self-assembled 4 nm FePt nanoparticles on a semi-conducting silicone substrate. The islands were exposed to 2 MeV $He^+$ ions at a dose of $2 \times 10^{16}$ ions per square centimeter. The samples were cooled during processing at room temperature. A contact mask was used to regulate the array of the ion beam for the irradiation and to shield the area from beam irradiation. The beam diameter, and thus the size of each island, can be controlled by hole size of the mask. The periodicity of the island array is dependent upon hole periodicity in the contact mask. After irradiation treatment, the sample was immersed into hexane for washing away non-linked material.

While the invention has been described in terms of preferred embodiments, those skilled in the art will recognize that the invention can be practiced with modification within the spirit and scope of the appended claims.

What is claimed is:

1. A method for linking self-assembled objects, comprising:

surrounding first objects with stabilizers;

self-assembling said first objects; and directing energy at said first objects and said stabilizers to link said first objects with second objects via said stabilizers and produce patterned linked objects.

2. The method of claim 1, wherein said first objects comprise one of a single nanoparticle, several nanoparticles, and an array of nanoparticles, and wherein a size of each said first object is less than about 1000 nanometers.

3. The method of claim 1, wherein said first objects have a shape of one of a sphere, an ellipsoid and a cylinder.

4. The method of claim 1, wherein said first objects comprise one of a metal and their alloys, metal oxides, metal salts, inorganic polymers and organic polymers.

5. The method of claim 3, wherein said stabilizer include one of molecules with end functional groups consisting of a —COO—, —CON—, —CN. —NC, —S—, —O—, —N—, and —P-type units.

6. The method of claim 5, wherein said stabilizer comprises one of molecules having intermolecular functional groups having a C—C double bond, a C—C triple bond, and —COO—, —CON—, —CN, —NC, —S—, —O—, —N—, and —P-type units.

7. The method of claim 1, wherein said directing is performed using one of a piezo-electric, electro-static, electro-magnetic, magnetic-strictive and thermal-mechanical actuator.

8. The method of claim 1, wherein said directing is performed using an air-bearing surface adapted to fly over said first objects.

9. The method of claim 1, wherein said directing is performed using one of a stencil and photoresist mask.

10. The method of claim 1, wherein said energy comprises one of electrons, ions, photons, phonons, plasmons, and excitons.

11. A method for forming patterned, self-assembled nanoparticles, comprising:

supplying first objects;

attaching stabilizers to said first objects;

supplying second objects;

selectively applying energy to said first objects and said stabilizers, such that said stabilizers link said first objects to said second objects to form self-assembled objects;

applying a solvent to remove non-linked objects; and annealing said self-assembled objects.

12. The method of claim 11, wherein said solvent comprises one of water, alcohol, an alkane, an arene, a chlorinated solvent, and solvents having functional groups —COO—, —CON—, —CN, —NC, —S—, —O—, —N—, and —P-type units.

13. The method of claim 11, wherein said annealing comprises applying thermal energy to said objects.

14. A method for forming patterned, self-assembled nanoparticles, comprising:

linking self-assembled objects by supplying first objects, a stabilizer to said first objects, supplying second objects, and involving energy to said first objects and said second objects such that said first objects link with said second objects to form said self-assembled objects;

applying a solvent to remove non-linked objects; and annealing said self-assembled objects, wherein said first objects and said second objects comprise nanoparticles.

* * * * *